United States Patent [19]

Fukaya

[11] 4,054,847
[45] Oct. 18, 1977

[54] PULSE OSCILLATOR CIRCUIT

[75] Inventor: Hirokazu Fukaya, Tokyo, Japan

[73] Assignee: Nippon Electric Co., Ltd., Tokyo, Japan

[21] Appl. No.: 654,788

[22] Filed: Feb. 3, 1976

[30] Foreign Application Priority Data

Feb. 4, 1975 Japan .................. 50-14612

[51] Int. Cl.² .......................................... H03K 3/64
[52] U.S. Cl. .................... 331/111; 331/145; 331/173; 331/53; 328/38
[58] Field of Search .................. 331/53, 111, 113, 145, 331/172, 173; 328/38; 307/225, 273, 290

[56] References Cited

U.S. PATENT DOCUMENTS

| | | | |
|---|---|---|---|
| 2,443,922 | 6/1948 | Moore | 331/145 |
| 3,049,676 | 8/1962 | Zinke | 331/113 |
| 3,154,752 | 10/1964 | Brauer | 331/173 |
| 3,268,738 | 8/1966 | Deavenport | 331/111 |
| 3,280,261 | 10/1966 | Korn | 331/113 |
| 3,339,155 | 8/1967 | Camenzind | 331/111 |
| 3,443,246 | 5/1969 | Brown et al. | 331/113 |
| 3,731,228 | 5/1973 | Kubo et al. | 331/111 |
| 3,745,380 | 7/1976 | Kitajima et al. | 331/113 |

OTHER PUBLICATIONS

RCA Tech. Notes 681, June 1966, Two Sheets.

Primary Examiner—John Kominski

[57] ABSTRACT

A pulse oscillator circuit comprises a first pulse oscillator, which may be in the form of a monostable multivibrator, that is capable of generating a first pulse. A second pulse oscillator, which may be in the form of an astable multivibrator, is operatively connected to the first pulse oscillator and is operated for the period for which the first pulse is present. The second pulse oscillator generates a second pulse of a pulse width that is narrower than the width of the first pulse.

4 Claims, 4 Drawing Figures

PULSE OSCILLATOR CIRCUIT

This invention relates generally to pulse oscillators, and more particularly to a pulse oscillator capable of generating a number of serial pulses that are synchronous with an input trigger signal.

A pluse oscillator of this type is used, for example, in a remote control circuit associated with a television receiver set for changing a television channel to be received. In this control circuit a predetermined number of serial pulses are generated in response to an input to the remote control circuit and applied to a channel converting circuit for automatically changing the television channel to be received.

One conventional pulse oscillator used for generating a predetermined number of serial pulses that are synchronous with an input trigger pulse comprises a serial pulse oscillator, e.g., an astable multivibrator, that is capable of generating serial pulses, a timing pulse oscillator capable of generating a timing pulse of predetermined width in response to an input trigger pulse, and a gate curcuit functioning as an AND circuit. The AND gate circuit receives the outputs of the two oscillators and generates a predetermined number of serial pulses corresponding to the period of the timing pulse width to be derived from the serial pulses. In this conventional circuit, the serial pulse oscillator and the timing pulse oscillator operate independently of each other, which results in variations in the number of output pulses that are derived. Furthermore, the occurrence of error—an extra number of pulses—is inevitable, depending upon the timing at which the input trigger signal is applied. Still further, the width and the repetition time of the pulses that are derived from this conventional pulse oscillator vary because the output pulses of the two oscillators vary in width and repetition time as a result of power source voltage fluctuations and operating temperature variations.

It is, therefore, an object of the invention to provide a pulse oscillator circuit that is capable of stably generating a predetermined number of serial pulses each time an input trigger signal is applied.

It is another object of the invention to provide a oscillator circuit of the type described, in which the number of pulses generated is stable regardless of the timing at which the input trigger signal is applied and which is unaffected by, power source voltage fluctuations and temperature variations.

The invention provides a pulse oscillator circuit comprising a monostable multivibrator capable of generating a timing pulse with having a first pulse width in response to an input trigger signal, and an astable multivibrator capable of generating serial pulses with a second pulse width that is narrower than the first pulse width in response to the timing pulse.

The pulse oscillator circuit according to another aspect of the invention comprises a first monostable multivibrator capable of generating a first pulse with a first pulse width and a second monostable multivibrator which is the same as the first monostable multivibrator in circuit construction except for a timing circuit and is capable of generating a second pulse with a second pulse width which is narrower than the first pulse width. An input terminal receives a trigger signal which triggers the first monostable multivibrator. A first switching means has one end connected to a power source terminal and is turned on by the output of the first monostable multivibrator, and a resistive element has one end connected to the other end of the first switching means. A second switching means is connected between the other end of the resistive element and ground and is turned on by the output of the second monostable multivibrator. The signal at the junction is transferred between the second switching means and the resistive element to the second monostable multivibrator to trigger the second monostable multivibrator when the signal at the junction moves to the side of the power source potential, thereby operating the second monostable multivibrator as an astable multivibrator for generating the period of the first pulse from the first monostable multivibrator.

The operation of the astable multivibrator is controlled by the timing pulse generated from the monostable multivibrator, thereby making it possible to maintain the number of the generated pulses stable regardless of the timing at which the input trigger signal is applied. Furthermore, the monostable multivibrator and the astable multivibrator are preferably constituted of the same monostable multivibrator circuit construction. This construction assures the stability of the number of pulses generated, because the ratio of the pulse width of the pulse generated by the monostable mutlivibrator to that generated by the astable multivibrator is kept constant regardless of power source voltage fluctuations and/or operating temperature variations.

The above and other objects and features of the invention will become apparent from the following description taken in conjunction with the accompanying drawings, wherein.

Figure 1:
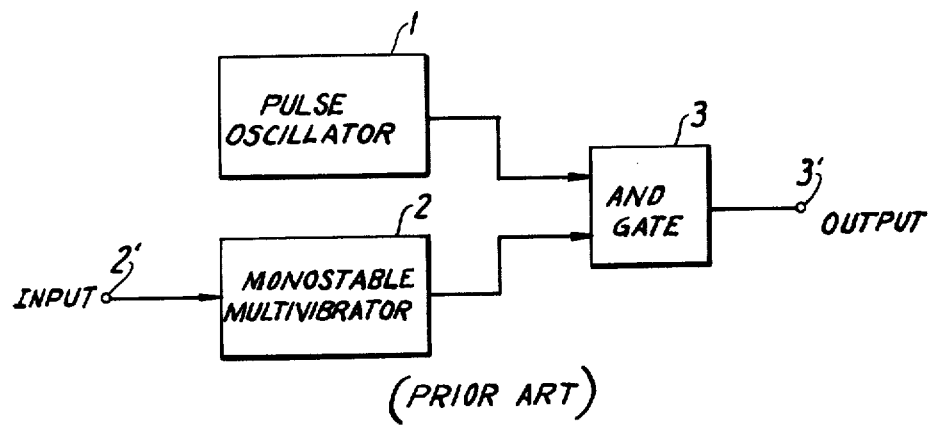
FIG. 1 is a block diagram showing the construction of a prior art pulse oscillator.

The prior art circuit for generating a given number of serial pulses in response to an input trigger pulse, as shown in FIG. 1, comprises a pulse oscillator 1, and a monostable multivibrator 2. The outputs of oscillator 1 and multivibrator 2 are applied to the inputs of an AND gate 3. The oscillator 1 oscillates independently to generate serial pulses having a pulse width $\tau$. The timing pulse of pulse width $n\tau$ (where $n$ is the given number) generated by the monostable multivibrator 2 in response to a trigger pulse applied to an input terminal 2 is applied to the other input terminal of the AND gate 3. Thus, $n$ numbers of pulses are supposed to be derived from the AND gate at the output terminal 3'. In practice, however, the number of pulses derived from the output terminal varies, being ($n$ + 1) numbers instead of $n$ numbers, depending upon the timing at which the trigger pulse is applied to the input terminal 2'. In addition, the serial pulse oscillator and the monostable multivibrator operate independently of each other, with the result that the width of the pulse generated by the former often differs from that of the pulse generated by the latter, as a result of power source voltage fluctuations and/or operating temperature variations, causing considerable instability in the number of pulses derived. One prior art solution to these problems has been to try to stabilize the oscillation of each oscillator regardless of power source voltage fluctuations and/or operating temperature variations. Moreover, it is necessary to establish oscillation synchronism between the serial pulse oscillator 1 and the monostable multivibrator 2. This approach, however, requires the design of intricate circuitry and makes it impossible to provide the desired number of pulses at the desired timing regardless of the timing for the synchronization.

Figure 2:
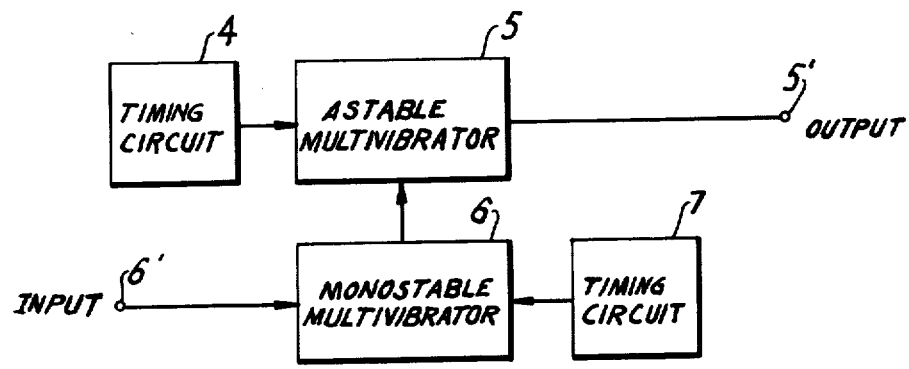
FIG. 2 is a block diagram showing the principles of a pulse oscillator of the invention.

In contrast, the circuit of the invention, as shown in block from in FIG. 2, comprises a timing circuit 4 having an output connected to a multivibrator 5. The output of timing circuit 4 determines the pulse width of the signal generated by multivibrator 5. A monostable multivibrator 6 is connected to a timing circuit 7 the output of which determines the pulse width of the multivibrator signal generated by 6, to enable the desired number of pulses to be stably generated. The output of multivibrator 6 is connected to the astable multivibrator 5. The monostable multivibrator 6 is driven a trigger signal, e.g. a trigger pulse, applied to an input terminal 6′, which, in turn, is connected to multivibrator 6. The width of the pulse generated by the astable multivibrator 5 is controlled by the timing circuit 4 whose time constant is $1/n$ (where $n$ is a given number) of the time constant of the timing circuit 7. The astable multivibrator 5 is operated only for the period for which the output of the monostable multivibrator 6 is present, to offer $n$ numbers of serial pulses at the output terminal 5′. Preferably the astable multivibrator 5 is the same as the monostable multivibrator in circuit construction is operated for an astable action under a feedback of its output to its input.

The operation of the astable multivibrator 5 is controlled so that the period for which it oscillates is limited to the duration for which the output timing pulse of the monostable multivibrator 6 is present. This permits the number of generated pulses to be constantly stabilized and the circuit construction to be markedly simplified.

According to another aspect of the invention, as stated above, the astable multivibrator 5 is preferably constituted to be constructionally the same as the monostable multivibrator 6. As the result of this arrangement, the ratio of the pulse width generated by the multivibrator 5, to that generated by the multivibrator 6, is kept constant even if the widths of the individual pulses generated from the respective multivibrators vary as a result of variations in the operating conditions, including the power source voltage and the operating temperature. Accordingly, the number of pulses generated remains stable at all times.

Figure 3A:
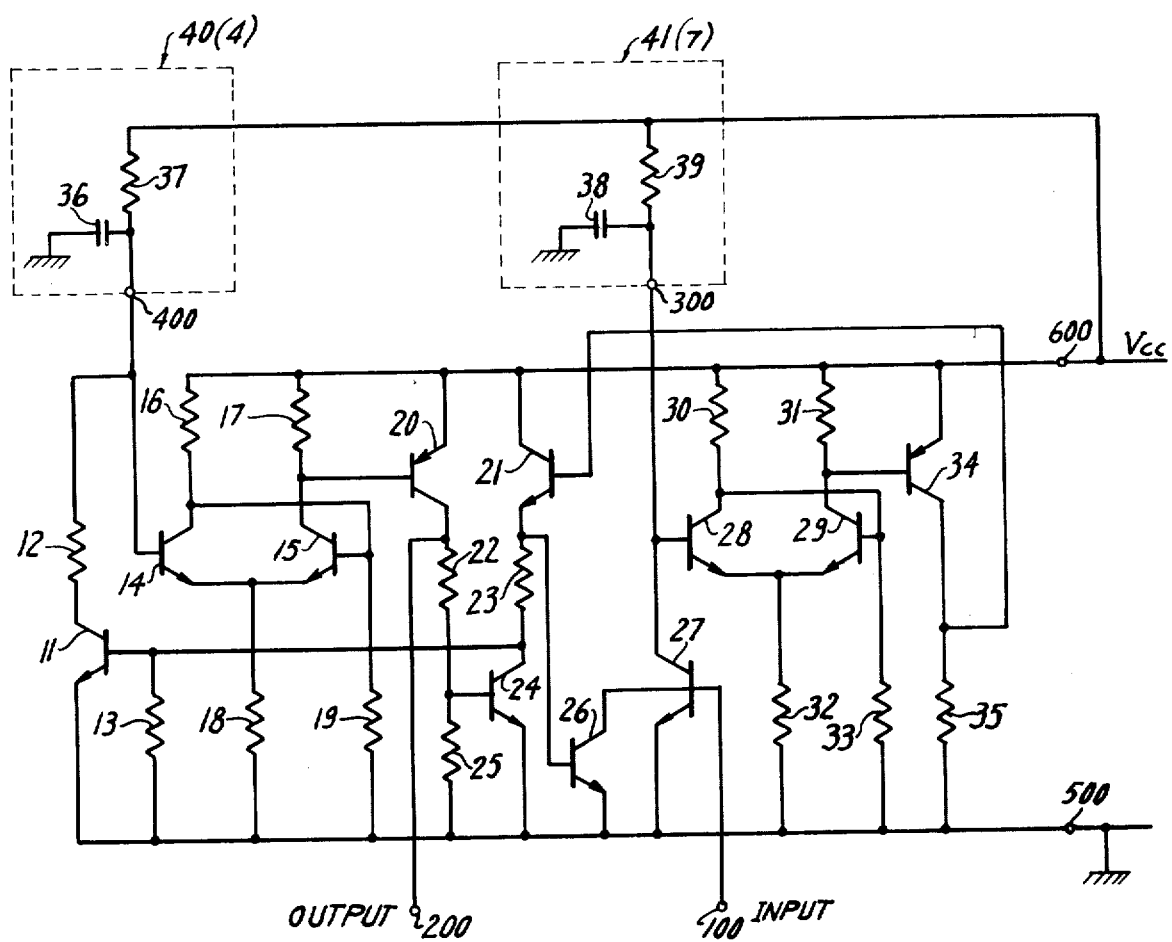
FIG. 3(A) is a circuit diagram showing one embodiment of the invention.
Figure 3B:
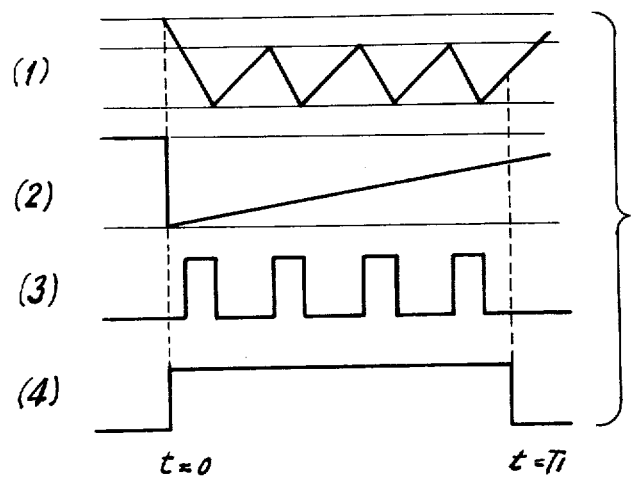
FIG. 3(B) shows voltage waveforms at essential points of the circuit of FIG. 3(A).

FIG. 3(A) illustrates a pulse oscillator circuit according to one embodiment oscillator, of the invention. Waveforms appearing at relevant points in this circuit are illustrated in FIG. 3(B). As shown, the circuit includes transistors 14 and 15, which together with resistors 16, 17, 18 and 19, constitute a first Schmitt trigger circuit. The output of the first Schmitt trigger circuit is amplified by an amplifier comprising transistors 20, 24 and resistors 22, 23 and 25, and fed back through a transistor 11 to control a timing circuit 40 having a time-constant $\tau$ (where $\tau$ is a predetermined time-constant) determined by a capacitor 36 and a resistor 37. This portion of the circuit of FIG. 3(A) constitutes an oscillator circuit functioning as an astable multivibrator corresponding to the astable multivibrator 5 in the block diagram circuit of FIG. 2. One end of the resistor 23 is connected to the emitter of a transistor 21, which is controlled through a transistor 34 by the output of a second Schmitt trigger circuit comprising transistors 28, 29 and resistors 30, 31, 32 and 33, the construction of which is the same as that of the first Schmitt trigger circuit. The resistor 35 serves as a load resistance to the transistor 34. The base of the transistor 28 is connected to a timing circuit 41 having a time-constant $n\tau$ (where $n$ is a given number) determined by a resistor 39 and a capacitor 38. Charging or discharging of this timing circuit 41 is controlled by a trigger signal applied to the input terminal 100. A transistor 26 is driven by the output of the second Schmitt trigger circuit, thereby establishing a monostable operation that is free from any noise that may be introduced at the input terminal 100.

In FIG. 3(B), the numerals (1) to (4) denote waveforms appearing at the points 400, 300, 200 and at the collector of of the transistor 34, respectively, in the circuit of FIG. 3(A). In the steady state, the base voltages of the transistors 14 and 28 are approximately equal to the power source voltage Vcc. When a trigger pulse is applied to the input terminal 100 at the time $t = 0$, the second Schmitt trigger circuit changes its state at its lower and upper threhold values V$l$ and V$u$ to generate a timing pulse (4) of FIG. 3(B) with a width T1, thereby causing the transistor 21 to turn on. This timing pulse turns on the transistor 11, which, in turn, drives the astable multivibrator comprising transistors 14, 15, 20, 24 and 11 for the duration of width T1, thus making the desired number of serial pulses (3) of FIG.3(B) available from the collector of the transistor 20. In the circuit of the invention, therefore, $n$ numbers of output pulses which are accurately synchronous with an input trigger pulse applied at the desired timing can be readily obtained.

The first Schmitt trigger circuit comprising transistors 14 and 15 has the same threshold values and the same circuit configuration as the second Schmitt trigger circuit comprising transistors 28 and 29. Therefore, the pulse width T1 of the output of the monostable multivibrator containing the second Schmitt trigger circuit is given as:

$$T1 = R_2C_2 l_n \frac{Vcc - Vl}{Vcc - Vu}$$

where
$C_2$: capacity of capacitor 38
$R_2$: resistance of resistor 39

The oscillation period To astable multivibrator containing the second Schmitt trigger circuit is given as:

$$To = R_1C_1 l_n \frac{Vcc - Vl}{Vcc - Vu} + RoC_1 l_n \frac{Vu}{Vl}$$

where
$C_1$: capacity of capacitor 36
$R_1$: resistance of resistor 37
$Ro$: resistance of resistor 12
When $R_1 > Ro$, then $$To = R_1C_1 l_n \frac{Vcc - Vl}{Vcc - Vu}$$

When
$nC_1R_1 = R_2C_2$,
$T_1 = nTo$
where $n$: a predetermined number.

These expressions signify the fact that the number of output pulses derived from the output terminal 200 for the period corresponding to the output pulse width T1 appearing at the collector of the transistor 34 is independent of power source voltage fluctuations, as well as of the threshold values thereof which may vary considerably with variations in the operating temperature. In other words, the pulse oscillator circuit of the invention can offer the desired number of pulses with stability against variations in the operating conditions.

Further, the electrical characteristics of the transistors 14, 15 28 and 29 can be easily matched in a semiconductor integrated circuit to define the upper and lower threshold voltages of the two Schmitt trigger circuits. In addition, the additional IC terminals can be limited to only two terminals 300 and 400 for receiving the timing circuits in addition to the input and output terminals 100 and 200, and the ground and power source terminals 500 and 600. These features makes the pulse oscillator circuit of the invention highly suitable for fabrication in a semiconductor integrated form.

It is apparent that the disclosed embodiment of the invention may be modified in many ways without departing from the invention. For instance, any other type of monostable multivibrator operating in a monostable manner may be used instead of the monostable multivibrator including the Schmitt trigger circuit and the timing circuit of the above described embodiment. The astable multivibrator may also be replaced with any other circuit that is operable in an astable form. Such astable multivibrator may be arranged preferably to use a monostable multivibrator having the same circuit as the monostable multivibrator which would control the operation of the astable multivibrator, and to operate as an astable multivibrator by a feedback loop from the output to the input terminals thereof.

What is claimed is:

1. A pulse oscillator circuit comprising a power source terminal; a ground terminal; an input terminal receiving a trigger signal; a first Schmitt trigger circuit having an input end and an output end; a first timing circuit having a first capacitor connected between said ground terminal and said input end of said first Schmitt trigger circuit and a first resistor connected between said power source terminal and said input end of said first Schmitt trigger circuit, said first capacitor and said first resistor determining a first time constant; a first switch being turned on for discharging the charge in said first capacitor in response to said trigger signal and turned off for preventing the discharge from said first capacitor during a time when an output pluse occurs at said output end of said first Schmitt trigger circuit; a second Schmitt trigger circuit having an input end and an output end; a second timing circuit having a second capacitor connected between said ground terminal and said input end of said second Schmitt trigger cirucit and a second resistor connected between said input end of said second Schmitt trigger circuit and said power source terminal, said second capacitor and said second resistor determining a second time constant smaller than said first time constant; a second switch being closed for discharging the charge in said second capacitor when no output pulse occurs at aid output end of said second Schmitt trigger circuit during the time when an output pulse occurs at said output end of said first Schmitt trigger circuit; and an output terminal coupled to said output end of said second Schmitt trigger circuit, thereby providing a predetermined number of pulses at said output terminal in response to said trigger signal.

2. The pulse oscillator circuit claimed in claim 1, further comprising a third switch having one end connected to said power source terminal and turned on by the output of said first Schmitt trigger circuit; a resistive element having one end connected to the other end of said third switch; a fourth switch connected between the other end of said resistive element and said ground terminal and turned on by the output of said second Schmitt trigger circuit; means for applying a signal at the junction between said third switch and said resistive element to said first switch to turn the same off during the time when the output pulse of said first Schmitt trigger circuit occurs; and means for applying a signal at the junction between said resistive element and said fourth switch to said second switch to discharge the charge in said second capacitor.

3. The pulse oscillator claimed in claim 1, wherein said first and second Schmitt trigger circuits are substantially identical to each other.

4. The pulse oscillator claimed in claim 2, wherein said first and second Schmitt trigger circuits are substantially identical to each other.

* * * * *